(12) United States Patent
Basker et al.

(10) Patent No.: US 9,704,993 B2
(45) Date of Patent: Jul. 11, 2017

(54) METHOD OF PREVENTING EPITAXY CREEPING UNDER THE SPACER

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Los Altos, CA (US); Sreenivasan Raghavasimhan, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/130,680

(22) Filed: Apr. 15, 2016

(65) Prior Publication Data

US 2016/0233337 A1    Aug. 11, 2016

Related U.S. Application Data

(62) Division of application No. 14/215,564, filed on Mar. 17, 2014, now Pat. No. 9,318,582.

(51) Int. Cl.
*H01L 29/06* (2006.01)
*H01L 29/78* (2006.01)
(Continued)

(52) U.S. Cl.
CPC .. *H01L 29/7848* (2013.01); *H01L 21/823431* (2013.01); *H01L 21/823456* (2013.01); *H01L 21/823468* (2013.01); *H01L 29/0649* (2013.01); *H01L 29/0847* (2013.01); *H01L 29/161* (2013.01); *H01L 29/165* (2013.01); *H01L 29/1608* (2013.01); *H01L 29/6681* (2013.01); *H01L 29/66545* (2013.01); *H01L 29/66795* (2013.01); *H01L 29/785* (2013.01); *H01L 29/7856* (2013.01)

(58) Field of Classification Search
None
See application file for complete search history.

(56) References Cited

U.S. PATENT DOCUMENTS

| 6,025,635 A | 2/2000 | Krivokapic |
| 6,992,354 B2 | 1/2006 | Nowak et al. |

(Continued)

OTHER PUBLICATIONS

List of IBM Patents or Patent Applications Treated as Related dated Apr. 15, 2016, 2 pages.

*Primary Examiner* — Cory Eskridge
(74) *Attorney, Agent, or Firm* — Scully, Scott, Murphy & Presser, P.C.; Steven J. Meyers (57) ABSTRACT

After forming a gate spacer on each sidewall of a sacrificial gate structure, portions of each dielectric fin cap portion underneath the gate spacer is intentionally etched and undercut regions that are formed are filled and pinched off with a dielectric material of a conformal dielectric liner. Portions of the conformal dielectric liner in the undercut regions are not subject to the undercut during an epitaxial pre-clean process performed prior to forming an epitaxial source region and an epitaxial drain region on opposite sides of the sacrificial gate structure and remain in the undercut regions after forming the epitaxial source region and the epitaxial drain region.

17 Claims, 11 Drawing Sheets

(51) Int. Cl.
*H01L 29/66* (2006.01)
*H01L 21/8234* (2006.01)
*H01L 29/08* (2006.01)
*H01L 29/16* (2006.01)
*H01L 29/161* (2006.01)
*H01L 29/165* (2006.01)

(56) References Cited

U.S. PATENT DOCUMENTS

| | | |
|---|---|---|
| 8,034,677 B2 | 10/2011 | Lin et al. |
| 8,969,963 B2 | 3/2015 | Basker et al. |
| 2007/0231983 A1 | 10/2007 | Shifren et al. |
| 2010/0133615 A1* | 6/2010 | Mulfinger ............ H01L 29/785 257/347 |
| 2011/0117679 A1 | 5/2011 | Lee et al. |
| 2013/0113027 A1 | 5/2013 | Chiang et al. |
| 2013/0200433 A1* | 8/2013 | Adam ............... H01L 29/66545 257/190 |
| 2015/0263128 A1 | 9/2015 | Basker |

* cited by examiner

METHOD OF PREVENTING EPITAXY CREEPING UNDER THE SPACER

BACKGROUND

The present disclosure relates to semiconductor device fabrication, and more particularly to a method to prevent undesired undercutting of dielectric fin caps during fin field effect transistor (FinFET) fabrication in a replacement gate scheme.

Fin field effect transistors (FinFETs) are one of the most promising candidates for scaling beyond 32 nm node. A FinFET typically includes a source region and a drain region interconnected by fins which serve as a channel region of the device and a gate that surrounds at least a portion of each of the fins between the source region and the drain region. Epitaxial deposition is typically used to form the source region and the drain region. Current epitaxial deposition processes typically require a pre-clean process to remove surface defects or contaminations residing on the starting surface of a semiconductor substrate targeted for deposition. The conventional pre-clean process generally uses either an aqueous solution of hydrogen fluoride (HF), or a gas phase HF to remove the surface defects or contaminations.

In fabricating FinFETs, it is desirable to have a relatively thick oxide (or other dielectric material) cap on top of each fin to prevent damages to the fins during device processing especially during gate spacer formation which typically involves a reactive ion etch (RIE). However, when the epitaxial deposition is applied for fabricating a source region and a drain region, portions of the thick oxide cap underneath the gate spacers are susceptible to undercut during the extensive epitaxy pre-clean process. The undercut leads to epitaxy creeping under the spacer and excessive dopant diffusion at the top of the fins. As such, a method to prevent undercutting of the oxide capping layer during the epitaxy pre-clean process is needed.

SUMMARY

The present disclosure provides a method to prevent undesired undercutting of dielectric fin caps during fin field effect transistor (FinFET) fabrication in a replacement gate scheme. After forming a gate spacer on each sidewall of a sacrificial gate structure, portions of each dielectric fin cap portion underneath the gate spacers are intentionally etched and undercut regions that are formed are filled and pinched off with a dielectric material of a conformal dielectric liner. Portions of the conformal dielectric liner in the undercut regions are not subject to the undercut during an epitaxial pre-clean process performed prior to forming an epitaxial source region and an epitaxial drain region on opposite sides of the sacrificial gate structure and remain in the undercut regions after forming the epitaxial source region and the epitaxial drain region.

In one aspect of the present disclosure, a method of forming a semiconductor structure is provided. In one embodiment, the method includes etching a semiconductor substrate to form a plurality of fin structures. Each of the plurality of the fin structures has a dielectric fin cap atop the fin structure. A sacrificial gate structure is then formed over the dielectric fin caps. A gate spacer is then formed on each sidewall of the sacrificial gate structure. Next, a dielectric fin cap portion is formed by removing portions of each of the dielectric fin caps that are not covered by the sacrificial gate structure or the gate spacer. Each of the dielectric fin cap portions is then laterally etched to provide an undercut region underneath each gate spacer. A dielectric liner portion is formed within each of the undercut regions. Next, an epitaxial source region and an epitaxial drain region are formed on portions of the fin structures that are not covered by the sacrificial gate structure, the gate spacers and the dielectric liner portions. After removing the sacrificial gate structure to expose remaining portions of the dielectric fin cap portions, the remaining portions of the dielectric fin cap portions are removed to form a gate cavity. The dielectric liner portions remain in the undercut regions during the forming of the epitaxial source region and the epitaxial drain region.

In another aspect of the present disclosure, a semiconductor structure is provided. The semiconductor structure includes a gate structure disposed on a channel portion of a fin structure, a gate spacer disposed on each sidewall of the gate structure, and a dielectric liner portion disposed underneath the gate spacer and in contact with the fin structure. The dielectric liner portion has a width less than a width of the gate spacer and an outer sidewall aligned with an outer sidewall of the gate spacer. The semiconductor structure further includes an epitaxial source region and an epitaxial drain region adjacent the gate spacers and the dielectric liner portions. The epitaxial source region and the epitaxial drain region contact portions of the fin structure exposed by the gate structure, the gate spacers and the dielectric liner portions.

DETAILED DESCRIPTION

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

Figure 1A:
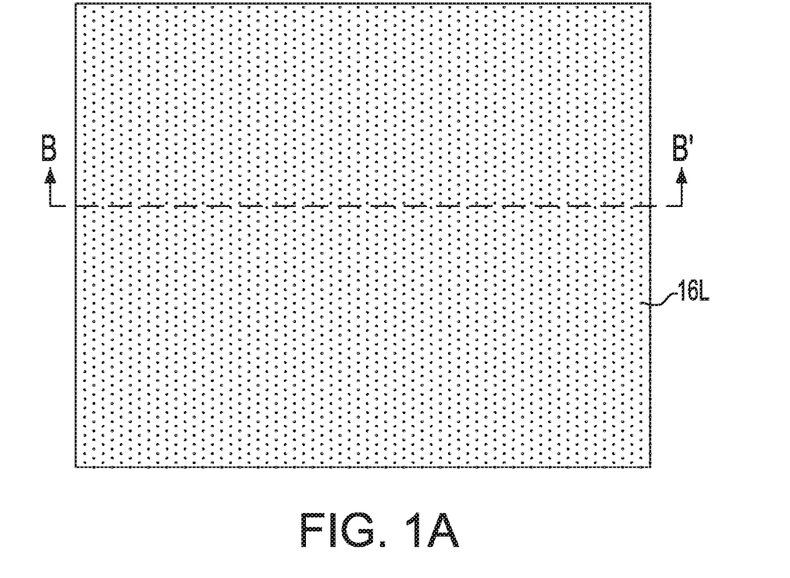
FIG. 1A is a top-down view of an exemplary semiconductor structure including a semiconductor substrate and a dielectric capping layer formed thereon that can be employed in accordance with an embodiment of the present disclosure.
Figure 1B:
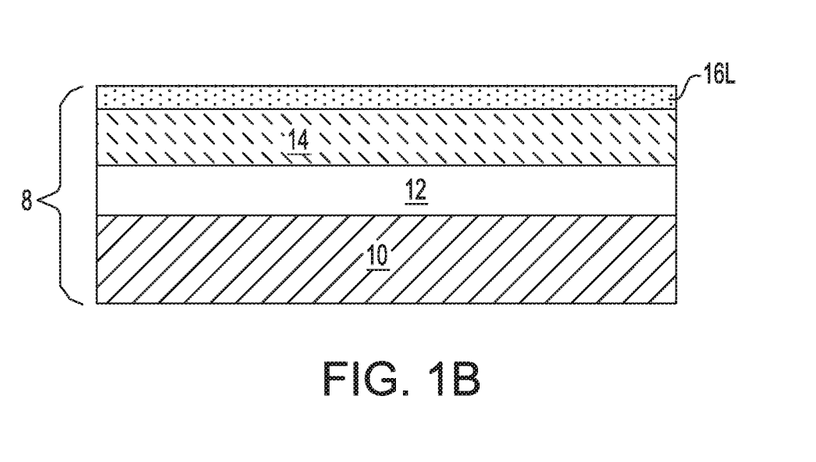
FIG. 1B is a cross sectional view of the exemplary semiconductor structure of FIG. 1A along line B-B'.

Referring to FIGS. 1A and 1B, there is illustrated an exemplary semiconductor structure that can be employed in one embodiment of the present disclosure. Specifically, the semiconductor structure includes a semiconductor substrate 8 having a dielectric capping layer 16L formed thereon. In one embodiment of the present disclosure and as shown in FIG. 1, the semiconductor substrate 8 is a semiconductor-on-insulator (SOI) substrate including a handle substrate 10, a buried insulator layer 12 and a top semiconductor layer 14.

In some embodiments of the present disclosure, the handle substrate 10 can include a semiconductor material, such as, for example, Si, Ge, SiGe, SiC, SiGeC, and III/V compound semiconductors. In other embodiments, the handle substrate 10 may be a dielectric material or a conductive material. In further embodiments, the handle substrate 10 can be omitted. When present, the handle substrate 10 provides mechanical support to the buried insulator layer 12 and the top semiconductor layer 14. The thickness of the handle substrate 10 can be from 30 µm to about 2 mm, although less and greater thicknesses can also be employed.

The buried insulator layer 12 includes a dielectric material such as silicon oxide, silicon nitride, silicon oxynitride, or a combination thereof. The thickness of the buried insulator layer 12 can be from 50 nm to 200 nm, with a thickness from 100 nm to 150 nm being more typical.

The top semiconductor layer 14 can include a semiconductor material such as, for example, Si, Ge, SiGe, SiC, SiGeC, and III/V compound semiconductors such as, for example, InAs, GaAs, and InP. The semiconductor materials of the top semiconductor layer 14 and the handle substrate 10 may be the same or different. Typically, each of the handle substrate 10 and the top semiconductor layer 14 comprises a single crystalline semiconductor material, such as, for example, single crystalline silicon. The top semiconductor layer 14 may or may not be doped with p-type dopants and/or n-type dopants. The thickness of the top semiconductor layer 14 can be from 10 nm to 200 nm, with a thickness from 30 nm to 70 nm being more typical.

In another embodiment of the present disclosure, the semiconductor substrate 8 is a bulk substrate (no shown). When a bulk semiconductor substrate is employed as semiconductor substrate 8, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor. In some embodiments, the semiconductor substrate 8 comprises a single crystalline semiconductor material, such as, for example, single crystalline silicon. In other embodiments, the semiconductor substrate 8 may comprise a polycrystalline or amorphous semiconductor material.

The dielectric capping layer 16L can be formed on a top surface of the top semiconductor layer 14. During the subsequent formation of the fin structures, a portion of the dielectric capping layer 16L provides a dielectric fin cap atop each fin structure. In one embodiment, the dielectric capping layer 16L includes an oxide. Examples of oxides that can be used as the dielectric capping layer 16L include, but are not limited to silicon oxide, zirconium oxide, tantalum oxide, hafnium oxide and aluminum oxide. The dielectric capping layer 16L can be formed by conventional deposition processes, such as, for example chemical vapor deposition (CVD) or plasma-enhanced CVD (PECVD). Alternatively, a thermal growing process such as thermal oxidation may be used in forming the dielectric capping layer 16L. The thickness of the dielectric capping layer 16L can be from 5 nm to 20 nm, although lesser and greater thicknesses can also be employed.

Figure 2A:
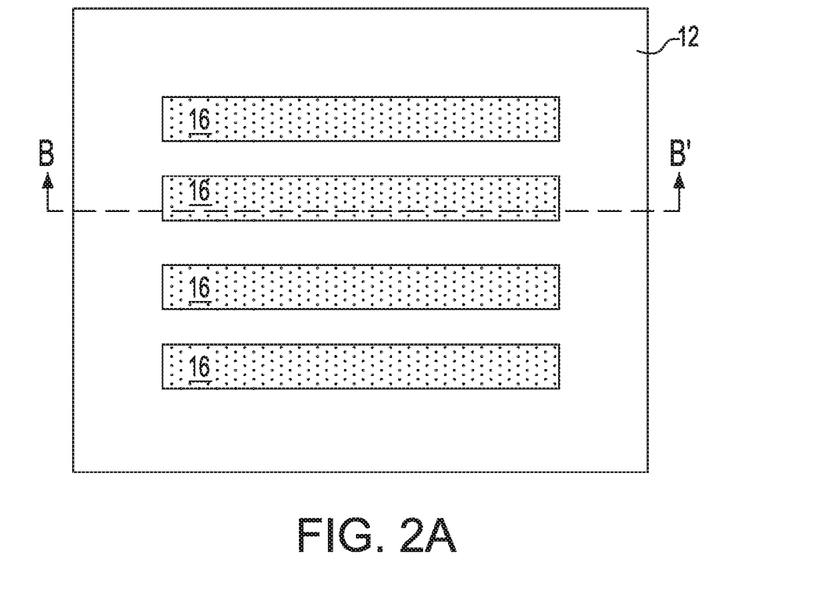
FIG. 2A is a top-down view of the exemplary semiconductor structure of FIG. 1A after forming a plurality of fin structures with a dielectric fin cap atop of each fin structure.
Figure 2B:
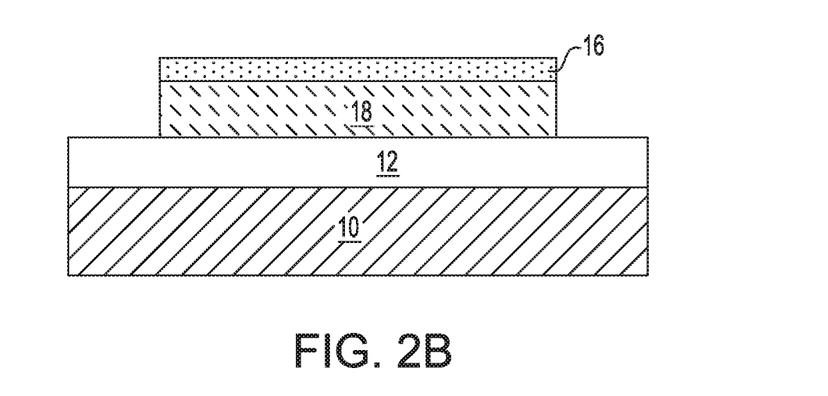
FIG. 2B is a cross sectional view of the exemplary semiconductor structure of FIG. 2A along line B-B'.

Referring to FIGS. 2A and 2B, there are illustrated the exemplary semiconductor structure of FIGS. 1A and 1B after forming a plurality of fin structures 18. In the illustrated embodiment of the present disclosure, each of the fin structures 18 has a bottommost surface that is located on a top surface of the buried insulator layer 12 of the SOI substrate.

The fin structures 18 can be formed by lithography and etching. Lithography can include forming a photoresist (not shown) on a top surface of the dielectric capping layer 16L, exposing the photoresist to a desired pattern of radiation, and then developing the exposed photoresist with a conventional resist developer to provide a patterned photoresist atop the dielectric capping layer 16L. A two-stage anisotropic etch may be conducted to transfer the pattern from the patterned photoresist into the dielectric capping layer 16L and the top semiconductor layer 14. In one embodiment, the etch used for pattern transfer may include a dry etch process such as, for example, RIE, plasma etching, ion beam etching or laser ablation. During the first stage of the anisotropic etch, the exposed portions of the dielectric capping layer 16L are removed selective to the top semiconductor layer 14, exposing portions of the top semiconductor layer 14. Remaining portions of the dielectric capping layer 16L after the lithographic patterning constitute a plurality of dielectric fin caps 16 and function as an etch mask that protects the underlying portions of the top semiconductor layer 14 from which the fin structures 18 are subsequently formed. During the second stage of the anisotropic etch, the exposed portions of the top semiconductor layer 14 are removed selective to the buried insulator layer 12 utilizing the underlying buried insulator layer 12 as an etch stop. Remaining portions of the top semiconductor layer 14 after the lithographic patterning constitute a plurality of fin structures 18. In one embodiment, each of the fin structure 18 is composed of silicon, and each dielectric fin cap 16 that is atop each of the fin structures 18 is composed of silicon oxide. After transferring the pattern into the dielectric capping layer 16L and the top semiconductor layer 14, the patterned photoresist can be removed utilizing a conventional resist stripping process such as, for example, ashing. Other methods known in the art such as sidewall image transfer (SIT) or directional self-assembly (DSA) can be used to pattern the fin structures.

Each of the fin structures 18 that are formed may have a height ranging from 5 nm to 200 nm, with a height ranging from 10 nm to 100 nm being more typical. Each of the fin structures 18 may have a width ranging from 4 nm to 50 nm, with a width ranging from 5 nm to 20 nm being more typical. Adjacent fin structures 18 may be separated by a pitch ranging from 20 nm to 100 nm. In one embodiment, the adjacent fin structures are separated by a pitch ranging from 30 nm to 50 nm.

Figure 3A:
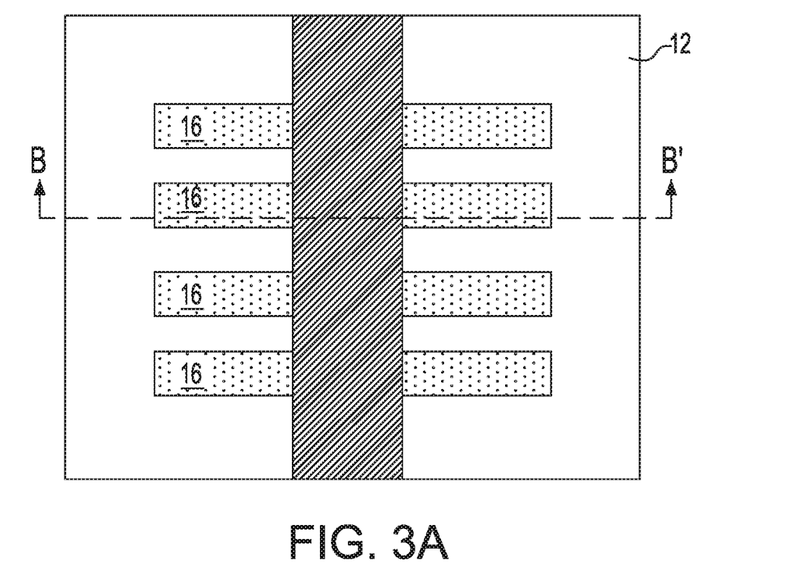
FIG. 3A is a top-down view of the exemplary semiconductor structure of FIG. 2A after forming a sacrificial gate stack that is oriented perpendicular to each fin structure.
Figure 3B:
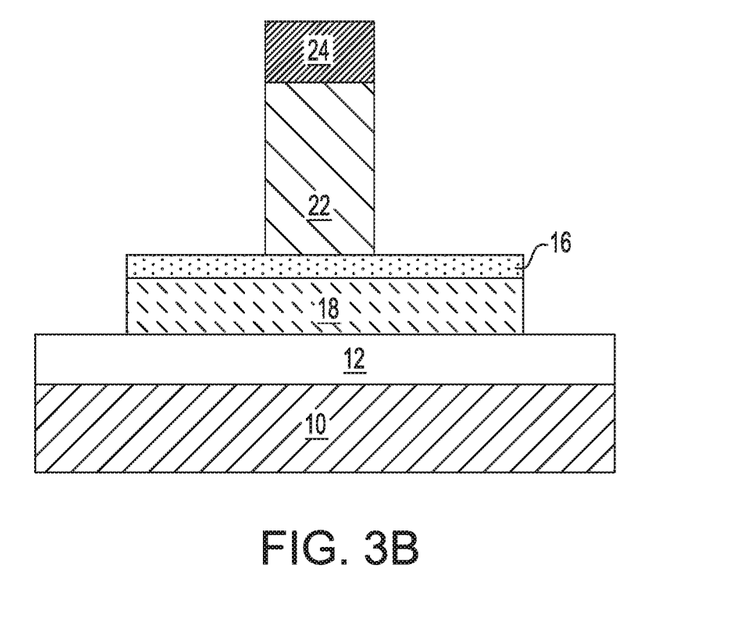
FIG. 3B is a cross sectional view of the exemplary semiconductor structure of FIG. 3A along line B-B'.

Referring now to FIGS. 3A and 3B, there are illustrated the exemplary semiconductor structure of FIGS. 2A and 2B after forming a sacrificial gate stack that is oriented perpendicular to and straddles each fin structure 18. The sacrificial gate stack includes, from bottom to top, a sacrificial gate structure 22 and a sacrificial gate cap 24. The term "sacrificial gate structure" as used herein refers to a placeholder structure for a functional gate structure to be subsequently formed. The term "functional gate structure" as used herein refers to a permanent gate structure used to control output current (i.e., flow of carriers in the channel) of a semiconducting device through electrical fields. Although only one sacrificial gate stack is described and illustrated, the present disclosure is not limited to such a number of sacrificial gate stacks. Instead, a plurality of sacrificial gate stacks can be formed upon portions of the semiconductor substrate 8.

The sacrificial gate structure 22 and the sacrificial gate cap 24 can be formed by depositing a sacrificial gate material layer (not shown) and a sacrificial gate capping layer (not shown), and subsequently lithographically patterning the sacrificial gate material layer and the sacrificial gate capping layer. A remaining portion of the sacrificial gate material layer after the lithographic patterning constitutes the sacrificial gate structure 22, and a remaining portion of the sacrificial gate capping layer after the lithographic patterning constitutes the sacrificial gate cap 24.

The sacrificial gate material layer includes a material that can be removed selective to the material of the dielectric fin caps 16. The sacrificial gate material layer can include a semiconductor material, a dielectric material that is different from the dielectric material of the dielectric fin caps 16, or a metallic material. Exemplary semiconductor materials that can be employed for the sacrificial gate material layer include silicon, germanium, a silicon germanium alloy, a silicon carbon alloy, a compound semiconductor material, or a combination thereof. Exemplary metallic materials that can be employed for the sacrificial gate layer include W, Co, TiN, TaN, and TiC. The sacrificial gate material layer can be deposited, for example, by CVD or PECVD. The thickness of the sacrificial gate material layer, as measured above a planar surface, can be from 50 nm to 300 nm, although lesser and greater thicknesses can also be employed.

The sacrificial gate capping layer may be composed of an oxide, nitride or oxynitride. In one embodiment, the sacrificial gate capping layer includes silicon nitride. The sacrificial gate capping layer can be formed using CVD, physical vapor deposition (PVD), thermal growth methods, or a combination thereof. The thickness of the sacrificial gate cap layer can be from 20 nm to 300 nm, although lesser and greater thicknesses can also be employed.

Figure 4A:
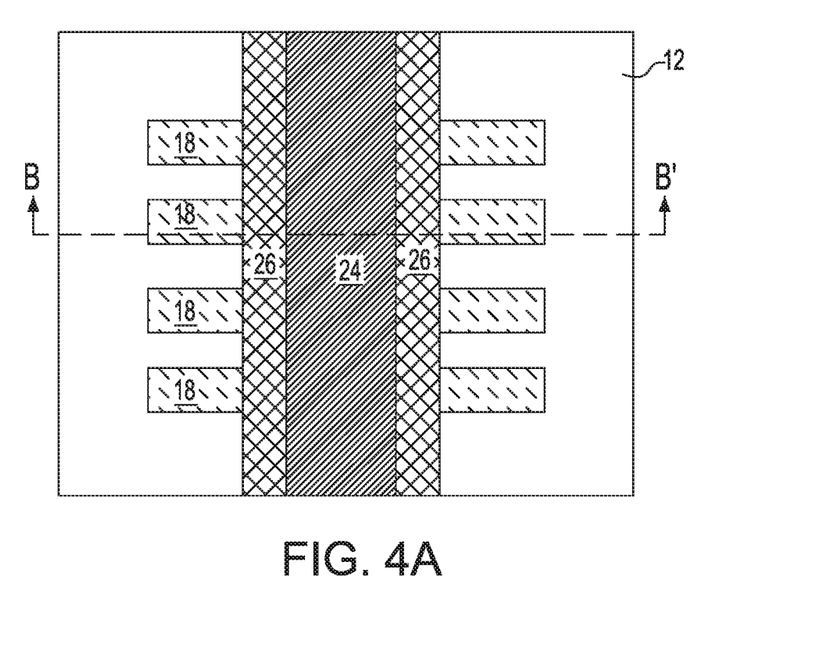
FIG. 4A is a top-down view of the exemplary semiconductor structure of FIG. 3A after forming a gate spacer on each sidewall of the sacrificial gate stack.
Figure 4B:
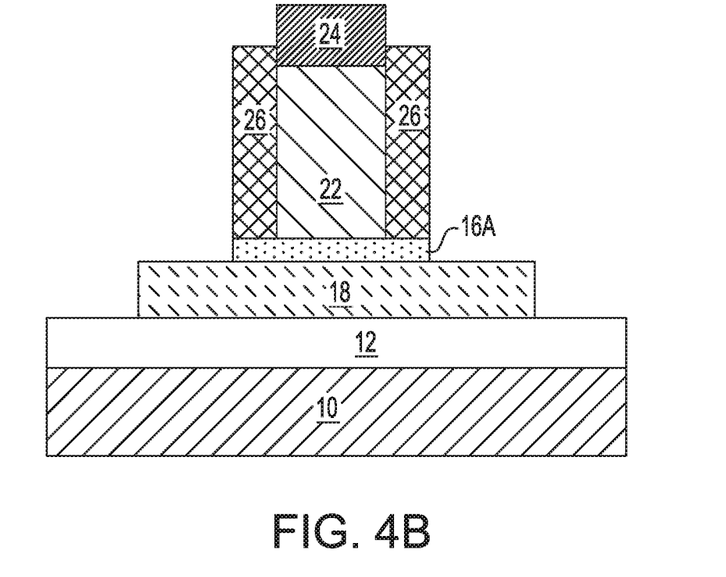
FIG. 4B is a cross sectional view of the exemplary semiconductor structure of FIG. 4A along line B-B'.

Referring now to FIGS. 4A and 4B, there are illustrated the exemplary semiconductor structure of FIGS. 3A and 3B after forming a gate spacer on each sidewall of the sacrificial gate stack (22, 24). A conformal spacer material layer (not shown) can be deposited on the sacrificial gate stack of the sacrificial gate structure 22 and the sacrificial gate cap 24 and over the dielectric fin caps 16, for example, by CVD or ALD. The conformal spacer material layer includes a dielectric material that is different from the dielectric material of the dielectric fin caps 16. In one embodiment and when the dielectric fin caps 16 include a dielectric oxide, the conformal spacer material is a dielectric nitride. Examples of the dielectric nitride include, but are not limited to, silicon nitride, and silicon oxynitride. In other embodiments, a low-k dielectric, such as, for example, SiBN and SiCN can be employed to form the conformal spacer material layer. The thickness of the conformal spacer material layer can be from 3 nm to 20 nm, although lesser and greater thicknesses can also be employed.

Horizontal portions of the conformal spacer material layer are subsequently removed by an anisotropic etch, such as, for example, a RIE process. In one embodiment of the present disclosure, the RIE process is continued so that vertical portions of the conformal spacer material layer that are formed on the sidewalls of the fin structures 18 are removed. The dielectric fin caps 16 protect the underlying fin structures 18 during the RIE process. The remaining vertical portions of the dielectric material layer constitute the gate spacers 26.

During the above mentioned anisotropic etch, portions of the dielectric fin caps 16 that are not covered by the sacrificial gate stack (22, 24) or the gate spacers 26 are typically also removed. If the anisotropic etch used in forming the gate spacers 26 does not remove the underlying dielectric fin caps 16, a separating etching process can be used to selectively remove the portions of the dielectric fin caps 16 that are not covered by the sacrificial gate stack (22, 24) or the gate spacers 26. The separate etching process may employ the same etch chemistry as the etch that forms the gate spacers 26, or may employ a different etch chemistry. The separate etch can be selective to the semiconductor material of the fin structures 18. The separate etch can be an anisotropic etch or an isotropic etch. Remaining portions of the dielectric fin caps 16 that are covered by the sacrificial gate stack (22, 24) and the gate spacers 26 are herein referred to as dielectric fin cap portions 16A.

Figure 5A:
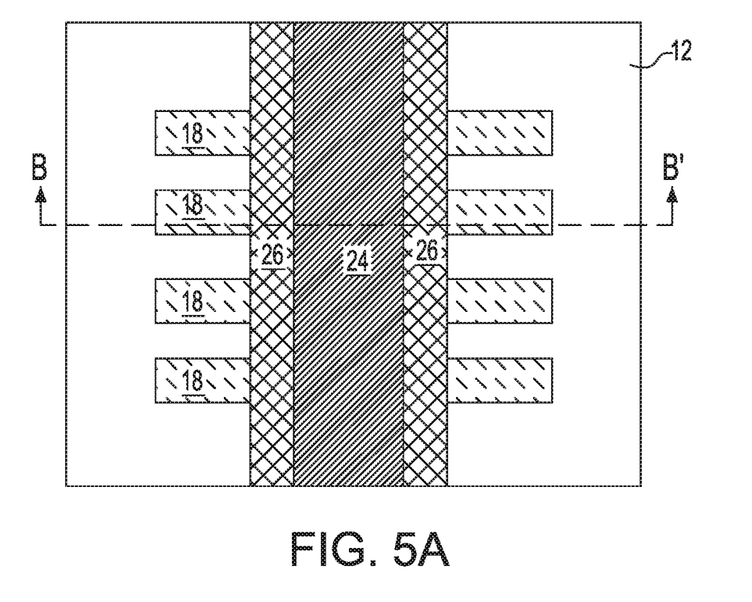
FIG. 5A is a top-down view of the exemplary semiconductor structure of FIG. 4A after undercutting and removing portions of the dielectric fin cap portions to provide undercut regions.
Figure 5B:
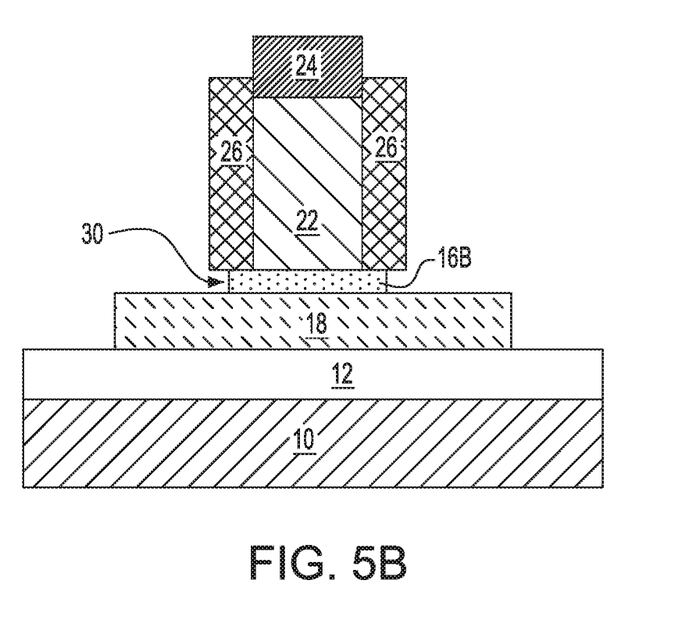
FIG. 5B is a cross sectional view of the exemplary semiconductor structure of FIG. 5A along line B-B'.

Referring to FIGS. 5A and 5B, there are illustrated the exemplary semiconductor structure of FIGS. 4A and 4B after undercutting and removing portions of the dielectric fin cap portions 16A to provide undercut regions 30. As is shown in FIG. 5B, the sidewalls of the dielectric fin cap portions 16A are laterally etched by a lateral distance. The lateral distance is typically no greater than the width of the gate spacers 26. The openings thus formed, which are defined by gaps between the gate spacers 26 and the fin structures 18, are herein referred to as undercut regions 30. In one embodiment, the lateral distance can be from 2 nm to 10 nm. The remaining portions of the dielectric fin cap portions 16A after the lateral undercut are herein referred to as recessed dielectric fin cap portions 16B.

The lateral etch can be provided by an isotropic etch, such as a wet etch having an etch selectivity for removing the dielectric fin cap portions 16A selective to the fin structures 18 and the gate spacers 26. This process laterally etches portions of the dielectric fin cap portions 16A underneath the spacers 26. In one embodiment, when the dielectric fin cap portions 16A is composed of silicon oxide and each gate spacer 26 is composed of silicon nitride, an isotropic etch, such as a wet etch using dilute hydrofluoric acid (DHF), may be used to selectively undercut the dielectric fin cap portions 16A.

Figure 6A:
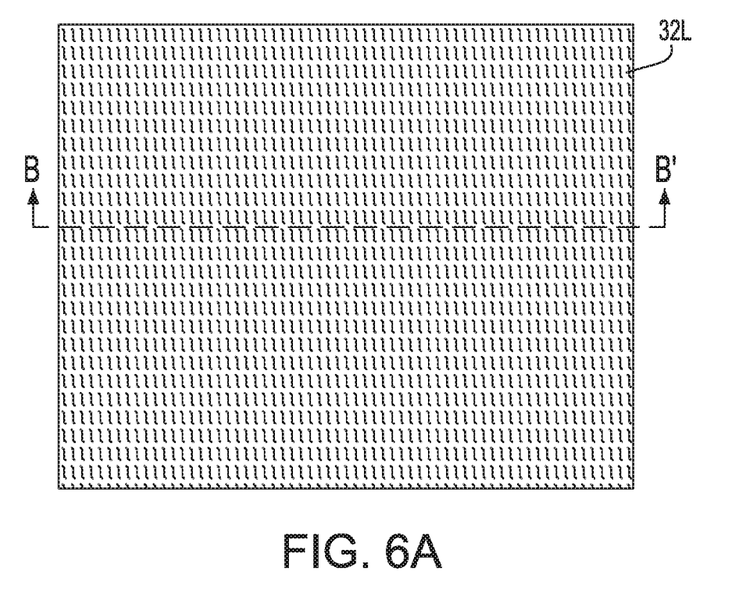
FIG. 6A is a top-down view of the exemplary semiconductor structure of FIG. 5A after forming a conformal dielectric liner over the sacrificial gate stack, the fin structures and a buried insulator layer of the semiconductor substrate.
Figure 6B:
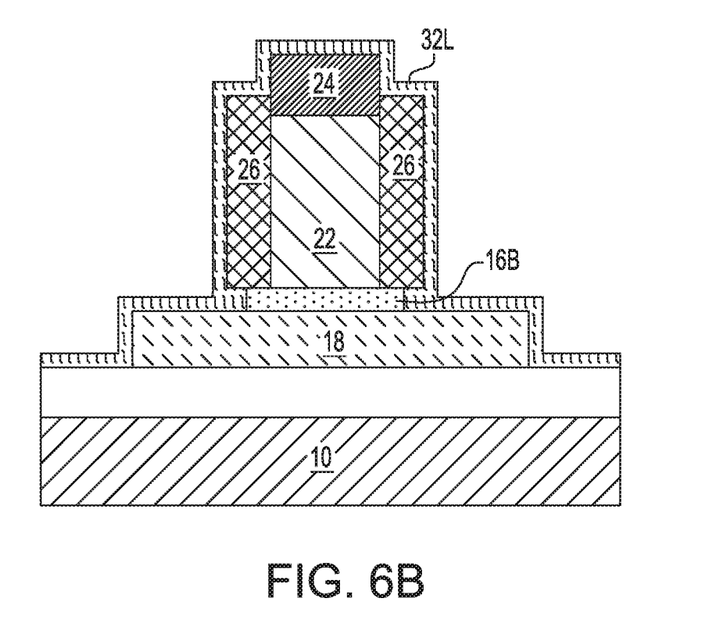
FIG. 6B is a cross sectional view of the exemplary semiconductor structure of FIG. 6A along line B-B'.

Referring to FIGS. 6A and 6B, there are illustrated the exemplary semiconductor structure of FIGS. 5A and 5B after forming a conformal dielectric liner 32L over the sacrificial gate stack (22, 24), the fin structures 18 and the buried insulator layer 12. The conformal dielectric liner 32L can be formed by using conventional deposition techniques, such as CVD or ALD and may be comprised of the same material as the gate spacers 26. The conformal dielectric liner 32L can comprise any suitable dielectric material such as, for example, silicon nitride, silicon oxynitride, or a low-k dielectric such as SiBN or SiCN. In one embodiment, the dielectric liner 32L may be comprised of silicon nitride. As the thickness of dielectric liner 32L increases during the deposition process, the undercut regions 30 are filled and pinched off with the dielectric material of the conformal dielectric liner 32L.

Figure 7A:
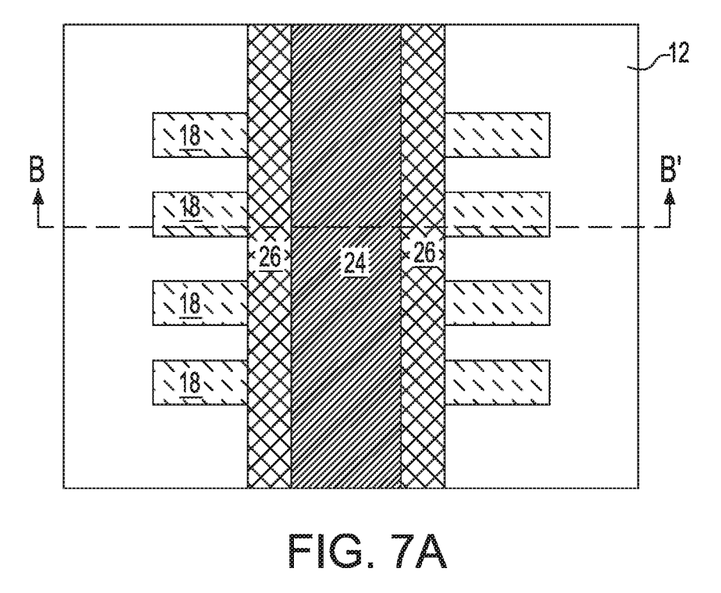
FIG. 7A is a top-down view of the exemplary semiconductor structure of FIG. 6A after forming dielectric liner portions.
Figure 7B:
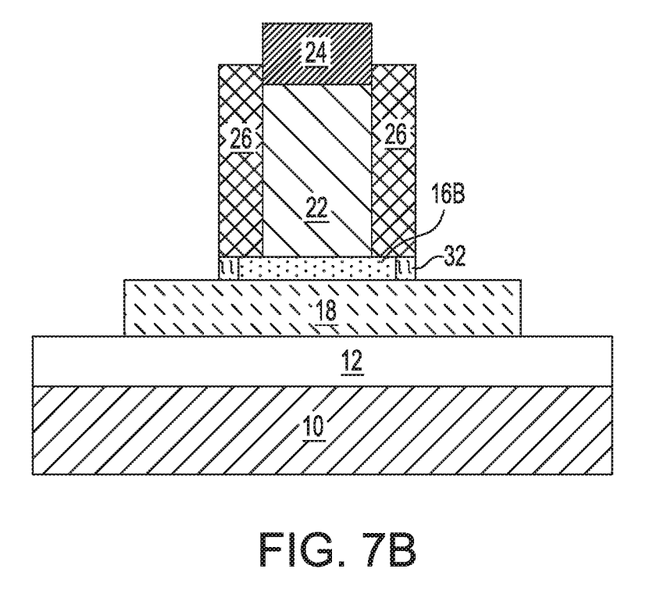
FIG. 7B is a cross sectional view of the exemplary semiconductor structure of FIG. 7A along line B-B'.

Referring to FIGS. 7A and 7B, there are illustrated the exemplary semiconductor structure of FIGS. 6A and 6B after forming dielectric liner portions 32. The dielectric liner portions 32 can be formed by removing portions of the conformal dielectric liner 32L that are not covered by the gate spacers 26 utilizing an isotropic etch, such as, for example, a wet etch process, and leaving portions of the conformal dielectric liner 32L in the undercut regions 30 intact. Remaining portions of the conformal dielectric liner 32L are herein referred to as dielectric liner portions 32. In one embodiment, the isotropic etch may remove the material of the conformal dielectric liner 32L selective to materials of the sacrificial gate cap 24, the gate spacers 26, the fin structures 18 and the buried insulator layer 12. In another embodiment, where the conformal dielectric liner 32L, the sacrificial gate cap 24 and the gate spacers 26 are composed of the same material, such as, for example, silicon nitride, the etch process can be timed so as to remove the conformal dielectric liner 32L with the exception of the pinched off region formed under the gate spacers 26. Each of the dielectric liner portions 32 that are formed has an outer sidewall that is aligned with an outer sidewall of each gate spacer 26. In one embodiment, each of the dielectric liner portions 32 has a width from 3 nm to 5 nm.

Figure 8A:
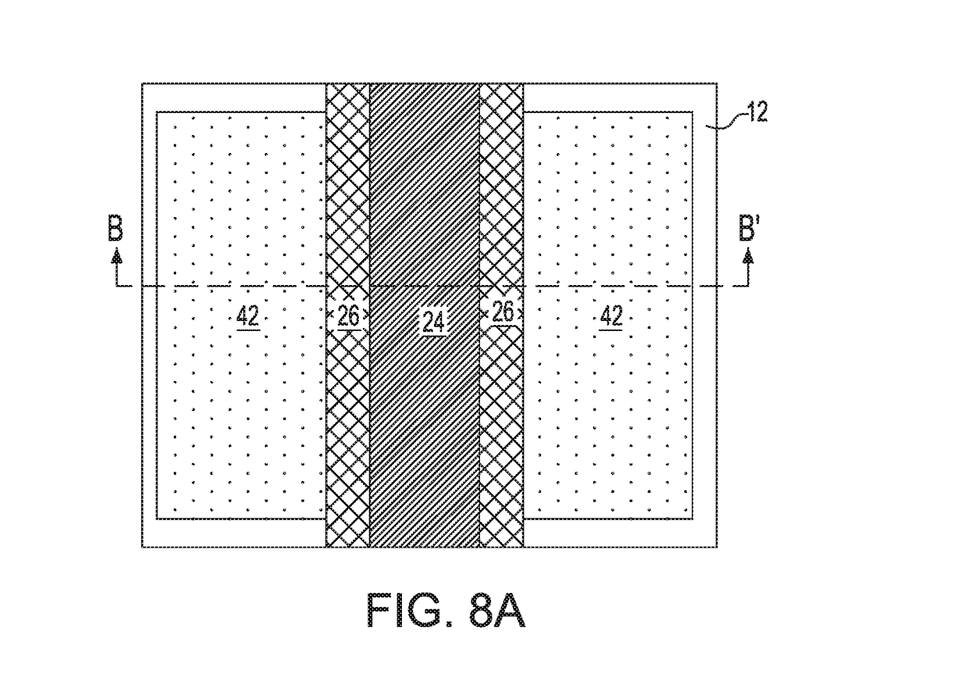
FIG. 8A is a top-down view of the exemplary semiconductor structure of FIG. 7A after forming a source region and a drain region adjacent the gate spacers, the dielectric liner portions and the fin structures.
Figure 8B:
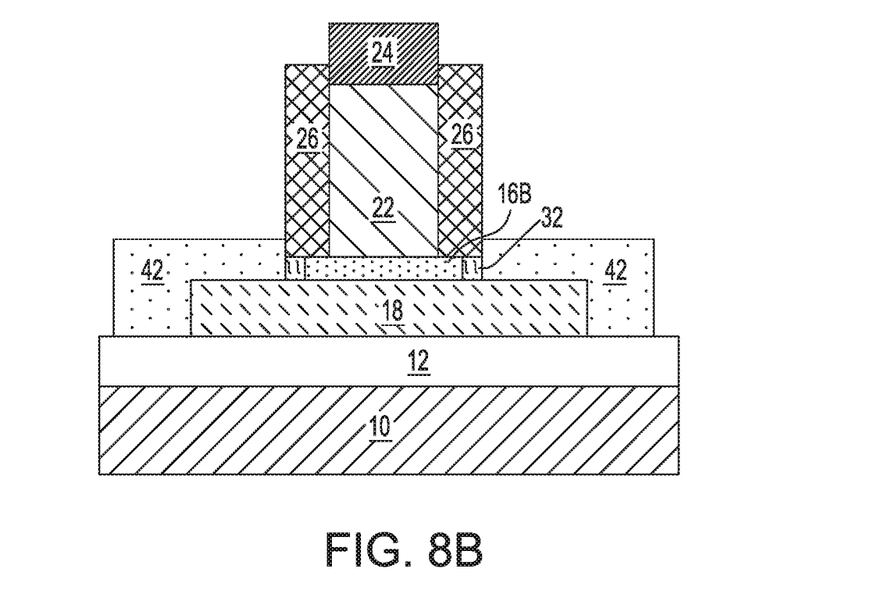
FIG. 8B is a cross sectional view of the exemplary semiconductor structure of FIG. 8A along line B-B'.

Referring to FIGS. 8A and 8B, there are illustrated the exemplary semiconductor structure of FIGS. 7A and 7B after forming a source region and a drain region (collectively referred to herein after as source and drain regions 42) adjacent the gate spacers 26, the dielectric liner portions 32 and the fin structures 18. The source and drain regions 42 can be formed by epitaxially depositing a semiconductor material over the exposed surfaces of fin structures 18, but not on dielectric surfaces such as the surfaces of the sacrificial gate cap 24, the gate spacer 26 and the buried insulator layer 12.

Prior to the epitaxial deposition of the semiconductor material, a series of wet cleans, dry cleans or other physical cleaning techniques may be performed to remove contaminants, such as, for example, resist residues and any remaining oxides from the exposed surfaces of the fin structures 18. The dielectric liner portions 32 remain in the undercut regions 30 after the pre-epitaxial clean processes.

The epitaxial grown of the semiconductor material can be effected by placing the exemplary semiconductor structure of FIGS. 7A and 7B into a reaction chamber, and simultaneously, or alternately, flowing at least one reactant gas (such as $SiH_4$, $Si_2H_6$, $SiH_2Cl_2$, $GeH_4$, $C_2H_2$, $C_2H_4$) and an etchant gas (such as HCl) into the reaction chamber. Optionally, a carrier gas such as $H_2$, $N_2$, $H_2$, and/or Ar can be flowed into the reaction chamber. The temperature for epitaxial deposition typically ranges from 550° C. to 1300° C. The apparatus for performing the epitaxial growth may include a CVD apparatus, such as atmospheric pressure CVD (APCVD), low pressure CVD (LPCVD) and PECVD.

The semiconductor material that can be epitaxially deposited includes any semiconductor material such as, for example, Si, SiGe and Si:C. In one embodiment, when the semiconductor structure of the present disclosure is a pFET, the source and drain regions 42 are comprised of SiGe. In another embodiment, when the semiconductor structure of the present disclosure is an nFET, the source and drain regions 42 are comprised of Si or Si:C.

The semiconductor material of the source and drain regions 42 can be deposited as an intrinsic semiconductor material, or can be deposited with in-situ doping. If the semiconductor material is deposited as an intrinsic semiconductor material, the source and drain regions 42 can be subsequently doped (ex-situ) utilizing ion implantation, gas phase doping or dopant out diffusion from a sacrificial dopant source material. For a pFET, the source and drain regions 42 are doped with a p-type dopant and for an nFET, the source and drain regions 42 are doped with an n-type dopant. Examples of p-type dopants include, but are not limited to, B, Al, Ga or In. Examples of n-type dopants include, but are not limited to, P, As or Sb. The p-type dopants or n-type dopants can be activated subsequently using a rapid thermal process.

Figure 9A:
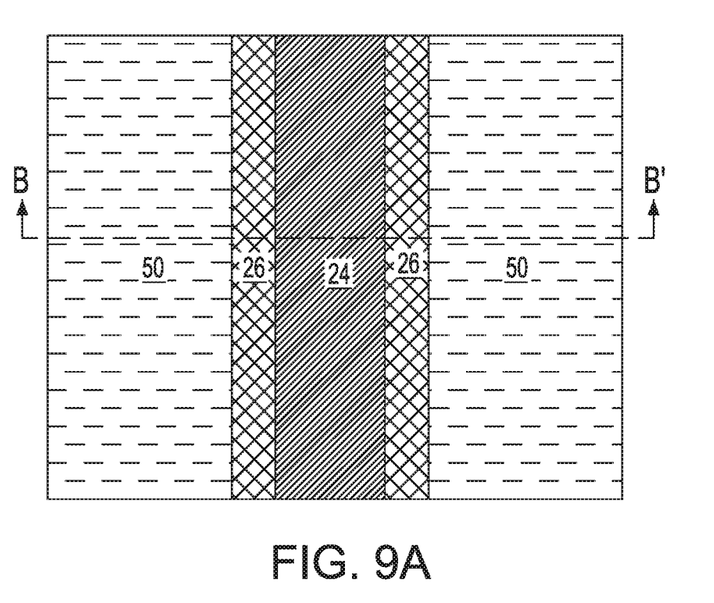
FIG. 9A is a top-down view of the exemplary semiconductor structure of FIG. 8A after forming an interlevel dielectric layer over the sacrificial gate stack, the gate spacers, the source region, the drain region and the buried insulator layer.
Figure 9B:
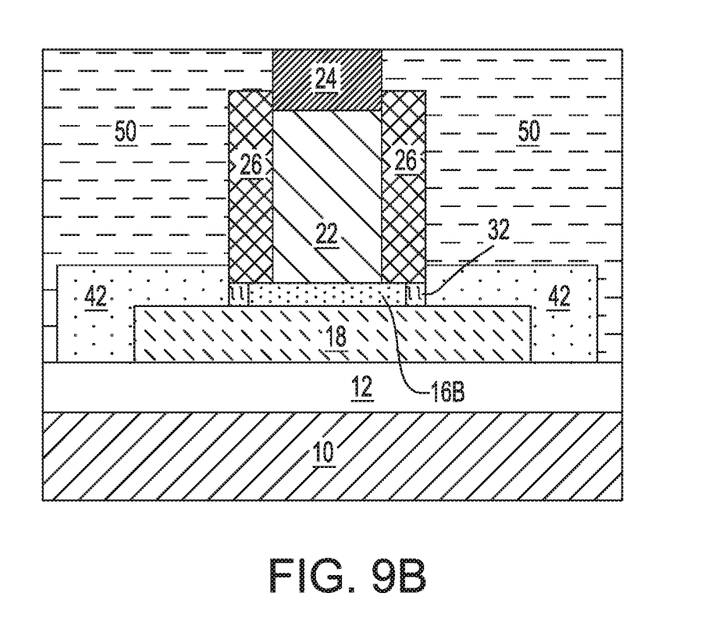
FIG. 9B is a cross sectional view of the exemplary semiconductor structure of FIG. 8B along line B-B'.

Referring to FIGS. 9A and 9B, there are illustrated the exemplary semiconductor structure of FIGS. 8A and 8B after forming an interlevel dielectric layer 50 over the sacrificial gate cap 24, the gate spacers 26, the source and drain regions 42 and the exposed portions of the buried insulator layer 12. The interlevel dielectric layer 50 includes at least one dielectric material, which can be silicon oxide, silicon nitride, silicon oxynitride, an organosilicate glass (OSG), or a combination thereof. The thickness of the interlevel dielectric layer 50 can be selected so that an entirety of the top surface of the interlevel dielectric layer 50 is formed above the top surface of the sacrificial gate cap 24.

The interlevel dielectric layer 50 can be subsequently planarized, for example, by chemical mechanical planarization (CMP) and/or a recess etch. In one embodiment, the sacrificial gate cap 24 can be employed as an etch stop.

Figure 10A:
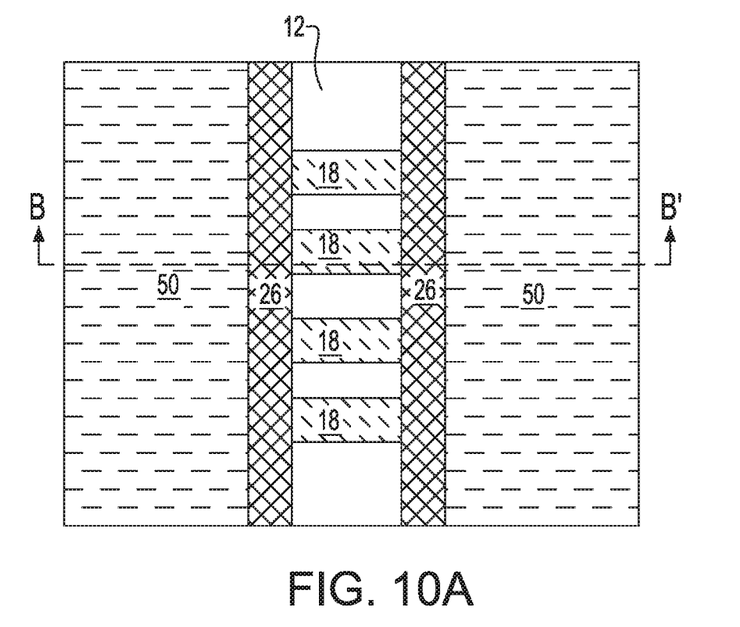
FIG. 10A is a top-down view of the exemplary semiconductor structure of FIG. 9A after removing the sacrificial gate stack and the recessed dielectric fin cap portions to form a gate cavity.
Figure 10B:
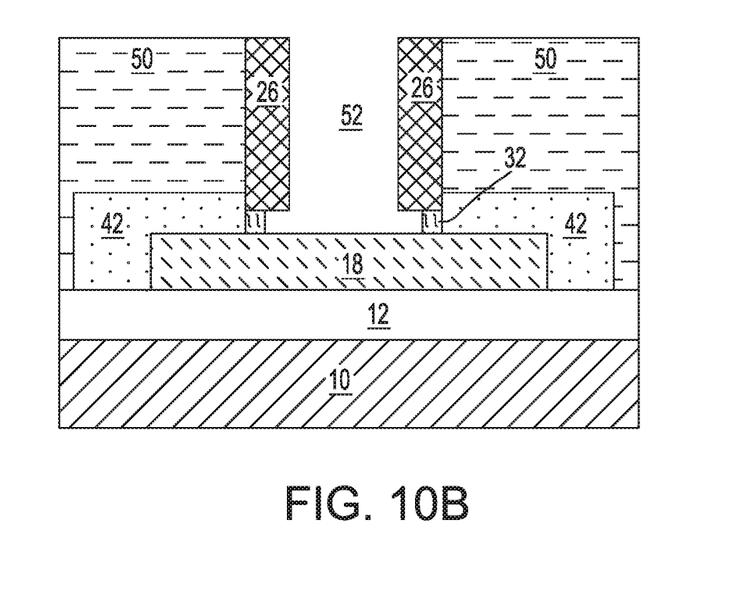
FIG. 10B is a cross sectional view of the exemplary semiconductor structure of FIG. 9B along line B-B'.

Referring to FIGS. 10A and 10B, there are illustrated the exemplary semiconductor structure of FIGS. 9A and 9B after removing the sacrificial gate cap 24, the sacrificial gate structure 22 and the recessed dielectric fin cap portions 16B to provide a gate cavity 52.

Additional portions of the interlevel dielectric layer 50 and the sacrificial gate cap 24 can be removed by an additional planarization process, which can be performed by additional CMP and/or an additional recess etch. In one embodiment, the sacrificial gate structure 22 can be employed as an etch stop and after removing the sacrificial gate cap 24, a top surface of the sacrificial gate structure 22 is physically exposed (not shown). The top surface of the interlevel dielectric layer 50 can be a planar surface.

The sacrificial gate structure 22 is then removed selective to the recessed dielectric fin cap portions 16B. The sacrificial gate structure 22 can be removed using a wet chemical etch or a dry etch. In one embodiment and when the sacrificial gate structure 22 is composed of polysilicon, the sacrificial gate structure 22 can be removed using a silicon-specific RIE process.

Next, the recessed dielectric fin cap portions 16B are removed selective to the fin structures 18. The recessed dielectric fin cap portions 16B can be removed using, for example, an isotropic RIE. A gate cavity 52 is formed within a volume from which the sacrificial gate structure 22 and the recessed dielectric fin cap potions 16B are removed and is laterally confined by inner sidewalls of the gate spacers 26 and the dielectric liner portions 32. In one embodiment, the gate cavity 52 has an inverted T-shape.

Figure 11A:
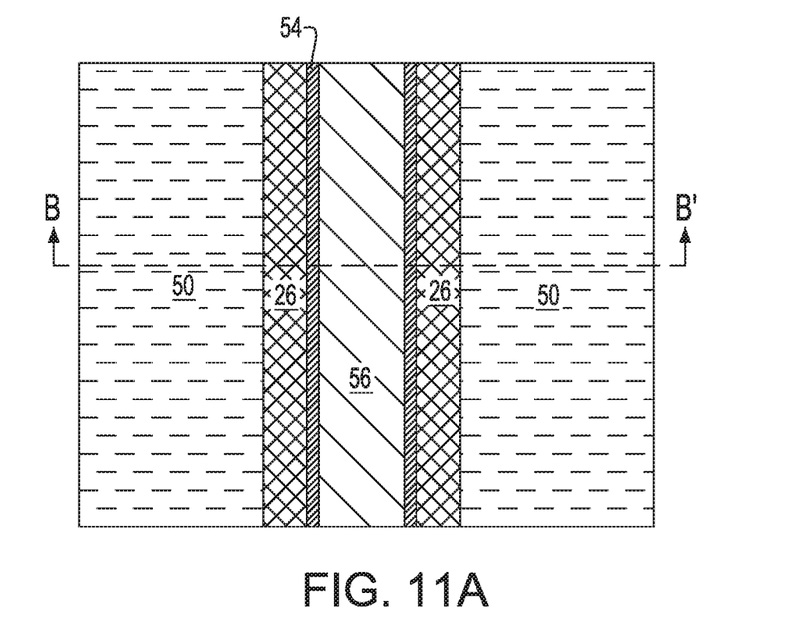
FIG. 11A is a top-down view of the exemplary semiconductor structure of FIG. 10A after forming a gate dielectric and a gate electrode within the gate cavity.
Figure 11B:
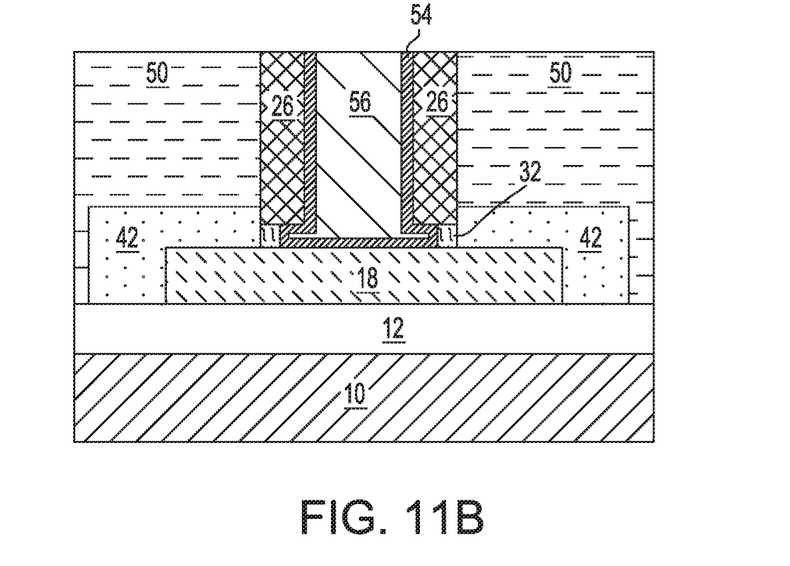
FIG. 11B is a cross sectional view of the exemplary semiconductor structure of FIG. 10B along line B-B'.

Referring to FIGS. 11A and 11B, there are illustrated the exemplary semiconductor structure of FIGS. 10A and 10B after forming a gate dielectric 54 and a gate electrode 56 within the gate cavity 52. The combination of the gate dielectric 54 and the gate electrode 56 defines a functional gate structure. In one embodiment, the functional gate structure has an inverted T-shape.

The gate dielectric 54 can be formed directly on each lengthwise sidewall of the fin structures 18. The gate dielectric 54 can be formed as a conformal layer, for example, by deposition of a dielectric material by CVD or ALD, or by conversion of surface portions of the fin structures 18 into a dielectric material such as silicon oxide, silicon nitride, or silicon oxynitride. In one embodiment, the gate dielectric 54 is composed of a high-k material having a dielectric constant greater than silicon oxide. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

The gate electrode 56 can be formed by filling remaining portions of the gate cavity 52 with at least one conductive material such as at least one metallic material and/or at least one doped semiconductor material. Examples of the conductive metal include, but are not limited to, Al, W, Cu, Pt, Ag, Au, Ru, Ir, Rh and Re, alloys of a conductive metal, e.g., Al—Cu, metal nitrides or carbides such as AN, TiN, TaN, TiC and TaC, silicides of a conductive metal, e.g., W silicide, and Pt silicide, and combinations thereof. The gate electrode 56 can be formed by depositing the conductive material utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, and chemical solution deposition. The portion of the at least one conductive material above the top surface of the interlevel dielectric layer 50 can be removed, for example, by chemical mechanical planarization. The portion of the gate dielectric 52, if formed above the top surface of the interlevel dielectric layer 50, may, or may not, be subsequently removed.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
   a gate structure located on sidewall surfaces and a top surface of a channel portion of a fin structure;
   a dielectric liner portion located over the fin structure and laterally contacting a bottom portion of each sidewall of the gate structure;
   a gate spacer located over the dielectric liner portion and laterally contacting a remaining portion of each sidewall of the gate structure, wherein an outer sidewall of the gate spacer is vertically aligned with an outer sidewall of the dielectric liner portion; and
   an epitaxial source region and an epitaxial drain region adjacent the gate spacer and the dielectric liner portion, the epitaxial source region and the epitaxial drain region vertically contacting portions of the fin structure exposed by the gate structure, the gate spacer and the dielectric liner portion, wherein
   the dielectric liner portion has a width no greater than a width of the gate spacer, and an inner sidewall of the dielectric liner portion is offset from an inner sidewall of the gate spacer.

2. The semiconductor structure of claim 1, wherein the width of the dielectric liner portion ranges from 3 nm to 5 nm.

3. The semiconductor structure of claim 1, wherein the width of the gate spacer ranges from 3 to 20 nm.

4. The semiconductor structure of claim 1, wherein each of the dielectric liner portion and the gate spacer comprises silicon nitride, silicon oxynitride, SiBN or SiCN.

5. The semiconductor structure of claim 1, wherein the dielectric liner portion has a thickness ranging from 5 nm to 20 nm.

6. The semiconductor structure of claim 1, wherein the gate structure has an inverted T-shape in which a portion of the gate structure contacting the dielectric liner portion has a width greater than a width of a remaining portion of the gate structure.

7. The semiconductor structure of claim 1, wherein the gate structure comprises a gate dielectric and a gate electrode overlying the gate dielectric.

8. The semiconductor structure of claim 7, wherein the gate dielectric contacts an inner sidewall of the dielectric liner portion, an inner sidewall and a bottom surface of the gate spacer, and the sidewall surfaces and the top surface of the channel portion of the fin structure.

9. The semiconductor structure of claim 7, wherein the gate dielectric comprises silicon oxide, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, SiN$_x$, a silicate thereof or an alloy thereof, wherein x is from 0.5 to 3, and y is from 0 to 2.

10. The semiconductor structure of claim 7, wherein the gate electrode comprises Al, W, Cu, Pt, Ag, Au, Ru, Ir, Rh and Re, an alloy thereof, a nitride thereof or a silicide thereof.

11. The semiconductor structure of claim 1, wherein the epitaxial source region and the epitaxial drain region comprise a doped semiconductor material.

12. The semiconductor structure of claim 11, wherein the epitaxial source region and the epitaxial drain region comprise doped Si, SiGe or Si:C.

13. The semiconductor structure of claim 1, further comprising an interlevel dielectric layer located over the epitaxial source region and the epitaxial drain region and laterally surrounding the gate spacer.

14. The semiconductor structure of claim 13, wherein the interlevel dielectric layer comprises silicon oxide, silicon nitride, silicon oxynitride, an organosilicate glass or a combination thereof.

15. The semiconductor structure of claim 1, further comprising a substrate located beneath the fin structure.

16. The semiconductor structure of claim 15, wherein the substrate comprises a handle substrate and a buried insulator layer located over the buried insulator layer.

17. A semiconductor structure comprising:
a gate structure located on sidewall surfaces and a top surface of a channel portion of a fin structure;
a dielectric liner portion located over the fin structure and laterally contacting a bottom portion of each sidewall of the gate structure;
a gate spacer located over the dielectric liner portion and laterally contacting a remaining portion of each sidewall of the gate structure, wherein an outer sidewall of the gate spacer is vertically aligned with an outer sidewall of the dielectric liner portion; and
an epitaxial source region and an epitaxial drain region adjacent the gate spacer and the dielectric liner portion, the epitaxial source region and the epitaxial drain region vertically contacting portions of the fin structure exposed by the gate structure, the gate spacer and the dielectric liner portion, wherein
the gate structure comprises a gate dielectric and a gate electrode overlying the gate dielectric, wherein the gate dielectric contacts an inner sidewall of the dielectric liner portion, an inner sidewall and a bottom surface of the gate spacer, and the sidewall surfaces and the top surface of the channel portion of the fin structure.

* * * * *